United States Patent [19]

Tsukahara

[11] Patent Number: 4,476,518

[45] Date of Patent: Oct. 9, 1984

[54] THICK FILM ELECTRONIC CIRCUIT

[75] Inventor: Michiyoshi Tsukahara, Soma, Japan

[73] Assignee: Alps Electric Co., Ltd., Tokyo, Japan

[21] Appl. No.: 372,196

[22] Filed: Apr. 26, 1982

[30] Foreign Application Priority Data

Apr. 27, 1981 [JP] Japan .................................. 56-63734

[51] Int. Cl.³ ........................ H01G 4/38; H01G 1/015
[52] U.S. Cl. ..................................... 361/328; 361/304
[58] Field of Search ................ 361/304, 321, 329, 402

[56] References Cited

U.S. PATENT DOCUMENTS 2,673,949  3/1954  Khouri ................................. 361/309
3,368,116  2/1968  Spaude ................................. 361/402
3,600,652  8/1971  Riley ................................... 361/321
3,821,617  6/1974  Shelby et al. ..................... 29/25.42 X Primary Examiner—Donald A. Griffin
Attorney, Agent, or Firm—Guy W. Shoup; Gerard F. Dunne

[57] ABSTRACT

In a thick film electronic circuit, a plurality of thick film capacitors are deposited on the surface of an insulating substrate. Each capacitor comprises a lower electrode and an upper electrode, which are essentially discrete for each capacitor, while a dielectric layer is deposited unitarily over each lower electrode and under each upper electrode of the capacitors.

5 Claims, 4 Drawing Figures

THICK FILM ELECTRONIC CIRCUIT

BACKGROUND OF THE INVENTION

This invention relates to a thick film electronic circuit and more particularly, to a thick film electronic circuit having a plurality of printed capacitors.

Printed capacitors are generally formed on an insulating substrate such as alumina by a method of printing process comprising forming a lower electrode, forming a dielectric layer on the lower electrode and further forming an upper electrode on the dielectric layer. The dielectric layer thus formed by the method of printing is typically porous and has low moisture resisting properties. Accordingly, a glass coating as a moisture-proofing protective film is often deposited on the capacitor. Since pin-holes and cracks are likely to occur on the glass coating, however, moisture may penetrate into the dielectric layer, reducing the dielectric characteristics and rendering the printed capacitor defective. It is often therefore necessary to inspect the insulation resistance of all the printed capacitors formed on the thick film electronic circuit. If a resistor 2 is formed in parallel to the capacitor 1 in a thick film electronic circuit such as shown in FIG. 1, however, it is not possible to measure the insulation resistance of the printed capacitor 1. To solve this problem, a conductive portion 3 may first be cut off so as not to form a circuit loop between the printed capacitor 1 and the resistor 2, and the insulation resistance of the capacitor 1 can then be measured and thereafter the cut portion 4 may be soldered. In FIG. 1, reference numerals 11, 12, 13 and 14 represent a lower electrode, a dielectric, an upper electrode and a glass coating, respectively. Since the cut portion 4 must be again connected by soldering, the conventional method has the shortcoming that the number of production steps increases to render the fabrication of the thick film electronic circuit all the more complicated and the production yield is eventually lowered.

SUMMARY OF THE INVENTION

The present invention is therefore directed to provide a thick film electronic circuit which eliminates the problems with the prior art circuits and which can be produced at a high yield and hence, at a reduced cost, without increasing the number of production steps.

Briefly stated, the present invention is characterized in that in a thick film electronic circuit, dielectric layers of a plurality of printed capacitors are formed so as to be interconnected to one another. In other words, since the dielectric layers of the plurality of printed capacitors are interconnected to one another, if the insulation resistance of one capacitor is inspected, the insulating properties of the rest can be checked at the same time.

These and other objects and features of the present invention will become more apparent from the following description taken in conjunction with the accompanying drawings.

DESCRIPTION OF THE PREFERRED EMBODIMENTS

Figure 1:
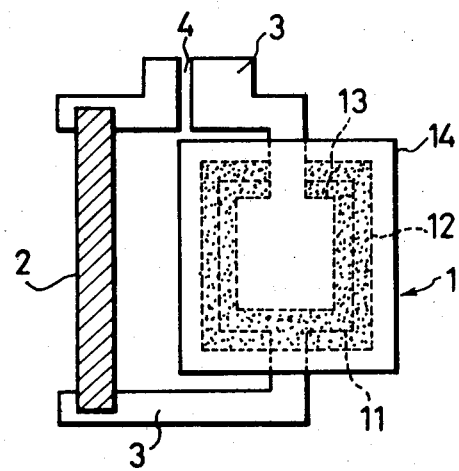
FIG. 1 is a front view showing the principal portions of a thick film electronic circuit in accordance with the conventional method.
Figure 2:
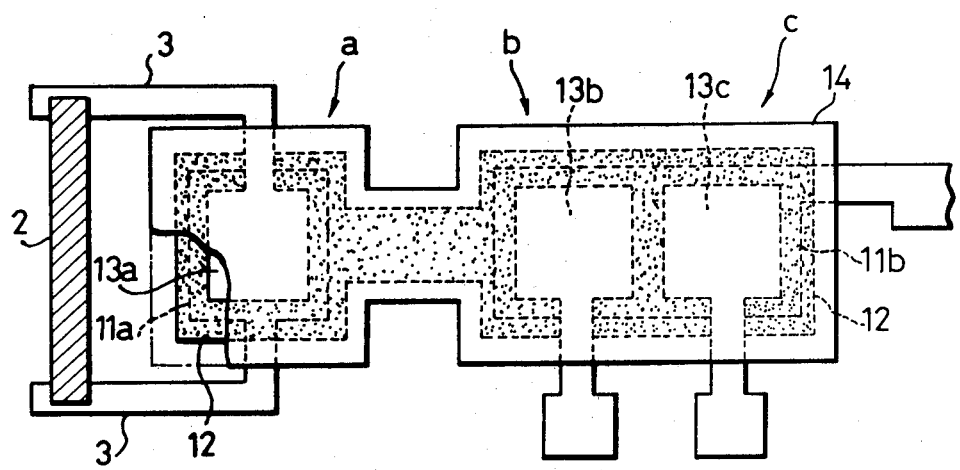
FIGS. 2 and 3 are front and sectional side views showing the principal portions of a thick film electronic circuit in accordance with an embodiment of the present invention, respectively.
Figure 3:
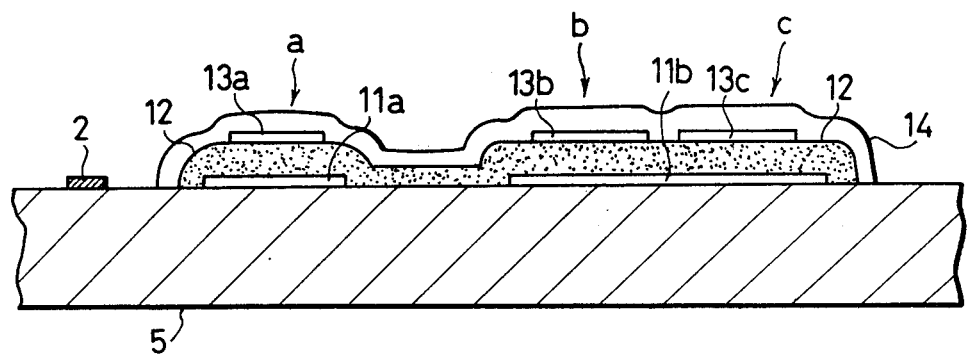

FIGS. 2 and 3 are front view and a sectional side view, each showing the principal portions of a thick film electronic circuit in accordance with an embodiment of the present invention. Symbols a, b and c represent the printed capacitors, respectively, and reference numerals 2 and 3 represent a resistor and a conductive portion, respectively. The printed capacitor a comprises a lower electrode 11a, a dielectric layer 12, an upper electrode 13a and a glass coating 14, and the printed capacitor b comprises a lower electrode 11b, the dielectric layer 12, an upper electrode 13b and the glass coating 14. Similarly, the printed capacitor c comprises a lower electrode 11b, the dielectric layer 12, an upper electrode 13c and the glass coating 14. The dielectric layers of these three printed capacitors a, b and c is formed simultaneously by a screen printing process so as to be interconnected to one another. In this embodiment, the dielectric layer of these printed capacitors a, b and c is shown formed by the same composition. In this embodiment, too, the resistor 2 is disposed in parallel to the capacitor a and hence, measurement of the insulation resistance of this capacitor is not possible. However, as the dielectric layer of the printed capacitors a, b and c is interconnected, the insulating property of the capacitor a can be checked if that of either one of the capacitors b and c is checked. Since the dielectric layer is porous, pin-holes may exist in the glass coating 14 of the printed capacitor a so that the glass coating 14 absorbs the moisture in the air, thus reducing the insulating resistance of the printed capacitor a. In such a case, the moisture transmits through the dielectric layers of the capacitors that are mutually interconnected and reaches also the capacitors b and c, deteriorating also their insulation resistance. Accordingly, the insulating property of the printed capacitor a can be checked by utilizing this phenomenon by checking the insulating property of either one of the capacitors b and c.

Figure 4:
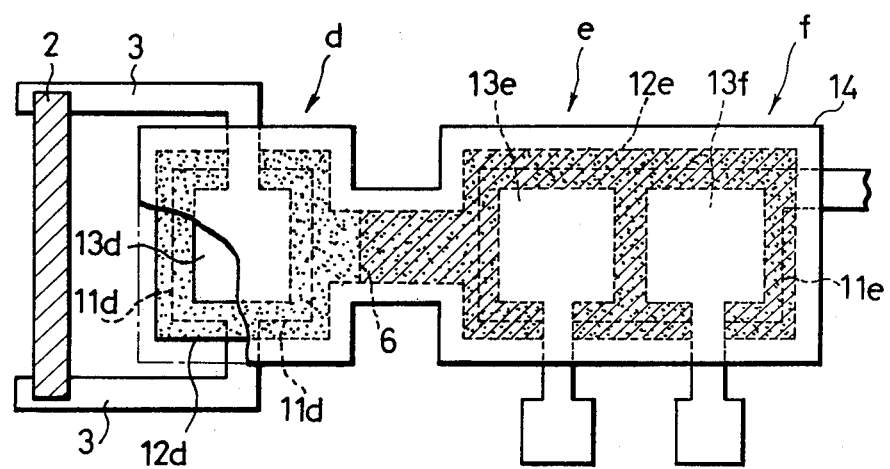
FIG. 4 is a front view showing the principal portions of a thick film electronic circuit in accordance with another embodiment of the present invention.

FIG. 4 is a front view of a thick film electronic circuit in accordance with another embodiment of the present invention. Symbols d, e and f represent printed capacitors and reference numerals 2 and 3 represent a resistor and the conductive portion, respectively. The printed capacitor d comprises the lower electrode 11d, the dielectric layer 12d, the upper electrode 13d and the glass coating 14 while the printed capacitor e comprises the lower electrode 11e, the dielectric layer 12e, the upper electrode 13e and the glass coating 14. The printed capacitor f comprises the lower electrode 11e, the dielectric layer 12e, the upper electrode 13f and the glass coating 14. Unlike the embodiment shown in FIGS. 2 and 3, the composition of the dielectric layer of the printed capacitor d is different from that of the dielectric layer of the printed capacitors e and f. The dielectric layers of the embodiment of FIG. 4 are porous even if the compositions for the dielectric layers are mutually different. Accordingly, if the moisture penetrates into any of the dielectric layers 12d, and 12e, it transmits to the dielectric layers if they are interconnected at the interconnecting portion 6, thereby reducing the insulation resistance of all the capacitors d, e and f. In this embodiment, too, the insulation resistance of the printed capacitor d can be checked by checking the insulation resistance of either one of the capacitors e and f, though the resistor 2 is disposed in parallel to the capacitor d.

As described in the foregoing, in a thick film electronic circuit having a plurality of printed capacitors, the present invention forms the dielectric layers of these capacitors so that they are interconnected to one another. This arrangement makes it possible to easily check the insulating property of a plurality of capacitors and provides the great advantage that the thick film electronic circuit can be economically produced without increasing the number of production steps.

What is claimed is:

1. In a thick film electronic circuit including a plurality of capacitors, each capacitor comprising: a lower electrode formed by a conductive material deposited on a surface of an insulating substrate by thick film techniques; a dielectric layer formed by a dielectric material deposited on said lower electrode by thick film techniques; an upper electrode formed by a conductive material deposited on said dielectric layer by thick film techniques; and a protective layer coated over said upper electrode layer, the improvement wherein the dielectric layers of each of said capacitors are formed unitarily.

2. A circuit according to claim 1, wherein said lower electrode, said dielectric layer, said upper electrode and said protective layer are formed by printed circuit techniques.

3. A circuit according to claim 1, wherein said protective layer is formed of a glass material.

4. A circuit according to claim 1, wherein said each dielectric layer is formed of the same material.

5. A circuit according to claim 1, wherein at least one of said dielectric layers is formed of a material different from those of other dielectric layers.

* * * * *